(12) United States Patent
Li et al.

(10) Patent No.: US 11,450,802 B1
(45) Date of Patent: Sep. 20, 2022

(54) THERMALLY SENSITIVE IONIC REDOX TRANSISTOR

(71) Applicant: National Technology & Engineering Solutions of Sandia, LLC, Albuquerque, NM (US)

(72) Inventors: Yiyang Li, Newark, CA (US); Albert Alec Talin, Dublin, CA (US); Elliot James Fuller, Dublin, CA (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 59 days.

(21) Appl. No.: 16/854,151

(22) Filed: Apr. 21, 2020

(51) Int. Cl.
*G11C 13/00* (2006.01)
*H01L 45/00* (2006.01)

(52) U.S. Cl.
CPC ........ *H01L 45/1206* (2013.01); *G11C 13/004* (2013.01); *G11C 13/0011* (2013.01); *H01L 45/085* (2013.01); *H01L 45/1266* (2013.01); *H01L 45/146* (2013.01); *H01L 45/147* (2013.01); *G11C 2013/0045* (2013.01); *G11C 2213/53* (2013.01)

(58) Field of Classification Search
CPC ........ G11C 2213/53; G11C 2013/0045; G11C 13/0007; G11C 13/0011; G11C 13/004; G11C 11/5685
See application file for complete search history.

(56) References Cited

U.S. PATENT DOCUMENTS

| 10,429,343 | B1 | 10/2019 | Talin et al. |
| 10,497,866 | B1 | 12/2019 | Fuller et al. |
| 2020/0028074 | A1* | 1/2020 | Defferriere .......... H01L 45/1213 |
| 2021/0125043 | A1* | 4/2021 | Bragaglia ........... H01M 50/431 |
| 2021/0184116 | A1* | 6/2021 | Han .................... H01L 45/1266 |

OTHER PUBLICATIONS

Kim, S. et al., "Metal-oxide based, CMOS-compatible ECRAM for Deep Learning Accelerator", In IEEE International Electron Devices Meeting, 2019, pp. 35.7.1-35.7.4.

\* cited by examiner

*Primary Examiner* — Alfredo Bermudez Lozada
(74) *Attorney, Agent, or Firm* — Calfee, Halter & Griswold LLP; Madelynne J. Farber; Samantha Updegraff

(57) ABSTRACT

A thermally sensitive ionic redox transistor comprises a solid channel, a solid reservoir layer, and a solid electrolyte layer disposed between the channel and the reservoir layer. A conductance of the channel is varied by changing the concentration of ions such as oxygen vacancies in the channel layer. Ionic conductivity of the gate, electrolyte, and channel layers increase with increasing temperature. Ion or vacancy transport between the channel and the reservoir layer across the electrolyte layer occurs in response to applying a voltage between the channel and the reservoir layer when the device is heated to an elevated temperature. When the device is cooled below the elevated temperature, the ions are trapped in one or more of the layers because the materials lose their ionic conductivity. A state of the redox transistor can be read by measuring the conductance of the channel.

20 Claims, 9 Drawing Sheets

THERMALLY SENSITIVE IONIC REDOX TRANSISTOR

STATEMENT OF GOVERNMENTAL INTEREST

This invention was made with Government support under Contract No. DE-NA0003525 awarded by the United States Department of Energy/National Nuclear Security Administration. The U.S. Government has certain rights in the invention.

FIELD

This disclosure relates to ionic redox transistors and more particularly to thermally sensitive ionic redox transitiors.

BACKGROUND

Neuromorphic computing is an emerging area of computing technology that is well-suited to efficiently perform operations associated with artificial neural networks (ANNs). In theoretical neuromorphic computing devices, analog memory elements both process and store weights associated with neurons and/or synapses in an ANN. While software has been developed to emulate the functionality of ANNs using conventional digital computing devices, these conventional computing devices are not designed for efficient execution of ANNs at a hardware level. Thus, conventional digital computing devices are generally inefficient when executing ANNs relative to theoretical performance of a neuromorphic computing device.

Some analog memory devices have been proposed for use in neuromorphic computers. For instance, Resistive Random-Access Memory (RRAM) and phase change memory (PCM) have been proposed for use in neuromorphic computers. RRAM or PCM, however, require large voltages and large currents to program, and are additionally highly unpredictable and nonlinear. For example, it is difficult to program the memory cell into a desired analog state owing to nonuniform heating and electric fields. Additionally, such materials have low channel resistance, drawing micro-amperes of current during read operations per device and precluding scaling into large, energy-efficient arrays.

Analog memory devices described in U.S. Pat. Nos. 10,429,343 and 10,497,866 address some of these shortcomings of RRAM and PCM and exhibit substantially linear programming. These devices employ ion transport from an electrochemical gate layer to a channel layer to vary conductance of the channel responsive to voltage pulses input to the memory device. However, at micro- and nano-scale, these devices are prone to information loss within only a few seconds after programming, which is believed to be due to charge leakage through electronic switches used to control programming of the devices, which in turn causes ionic migration in the devices. Furthermore, these devices rely on lithium polymers and/or ionic liquids, which makes these devices difficult to fabricate using conventional complementary metal-oxide-semiconductor (CMOS) fabrication techniques.

SUMMARY

The following is a brief summary of subject matter that is described in greater detail herein. This summary is not intended to be limiting as to the scope of the claims.

Various technologies pertaining to a thermally sensitive ionic redox transistor that is suited for analog neuromorphic computing are described herein. In an exemplary embodiment, a thermally sensitive ionic redox transistor comprises a variable-conductance solid channel, a solid electrolyte layer disposed in contact with the channel, and a solid reservoir layer that is disposed in contact with the electrolyte layer, such that the electrolyte layer is positioned between the channel and the reservoir layer. The redox transistor further comprises source and drain contacts that are positioned at opposite ends of the channel, and a gate contact that is positioned on an opposite end of the reservoir layer relative to the electrolyte layer. The ionic conductivity of one or more layers, or at the interfaces between layers, is thermally activated such that the ionic conductivity is high at elevated temperatures (e.g., between about 80° C. and about 300° C., between about 100° C. and about 250° C., or between about 125° C. and about 200° C.) and ions are mobile between the layers, and at low temperatures (e.g., less than 50° C., between about 0° C. and about 50° C., or between about 10° C. and about 50° C.) the conductivity is low and ions in the one or more layers are effectively immobile. Thus, as will be described in greater detail herein, at elevated temperatures, the device can be programmed, and at low temperatures, the device retains state for extended periods (e.g., about 10 days with less than 2% change in state value).

The channel is made up of an ionic material whereby certain ions are mobile at the elevated programming temperature; as used herein, the term "ions" includes interstitials and vacancies. By way of example, and not limitation, the channel can be composed of a nonstoichiometric transition metal oxide like titanium oxide, where the mobile ion is oxygen vacancies. Electronic conductance of the channel (e.g., conductance of the channel as measured between the source and drain contacts) varies with the concentration of ions in the channel layer. The reservoir layer is also an ionic material which has the same mobile ion as the channel. A state of the redox transistor can be read by applying a voltage between the source and drain contacts, measuring a resultant current between the source and drain contacts, and computing a conductance or resistance of the channel based upon the applied voltage and the measured current.

The state of the redox transistor can be written by heating the redox transistor to an elevated temperature where the ionic conductivity of a layer is at least 100 times higher than the ionic conductivity of that layer at the low temperature state in one or more of the layers. As used herein, ions in the elevated-temperature (between about 80° C. and about 300° C., between about 100° C. and about 250° C., or between about 125° C. and about 200° C.) state are referred to as "mobile" and the ions in the low temperature state (less than 50° C., between about 0° C. and about 50° C., or between about 10° C. and about 50° C.) as "immobile." At elevated temperatures, applying a voltage pulse between the gate contact and at least one of the source or the drain contacts causes electrons to flow from the gate to the source/drain or vice versa. When the device is at low temperatures, the ionic conductivity of the ions in one or more of the materials is too low to allow substantial transport of the ions between the channel layer and the reservoir layer.

However, when the device is heated to the elevated temperature, application of the voltage pulse between the gate contact and at least one of the source or the drain contacts causes ions to move from the reservoir layer to the channel layer (or vice versa) as a result of the flow of electrons between the gate and the source or drain. Therefore, application of a voltage pulse between the gate contact and the source or drain contacts causes substantial changes in the conductance state of the channel layer only when the device is heated to the elevated temperature. The low ionic conductance of one or more of the layers when the device is at low temperatures also prevents information loss of the transistor (e.g., change of electronic conductance of the channel layer between the source contact and the drain contact) when the reservoir layer and the channel layer are electrically shorted (e.g., by shorting the gate contact with either of the source or the drain contacts).

The above summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

DETAILED DESCRIPTION

Figure 1:
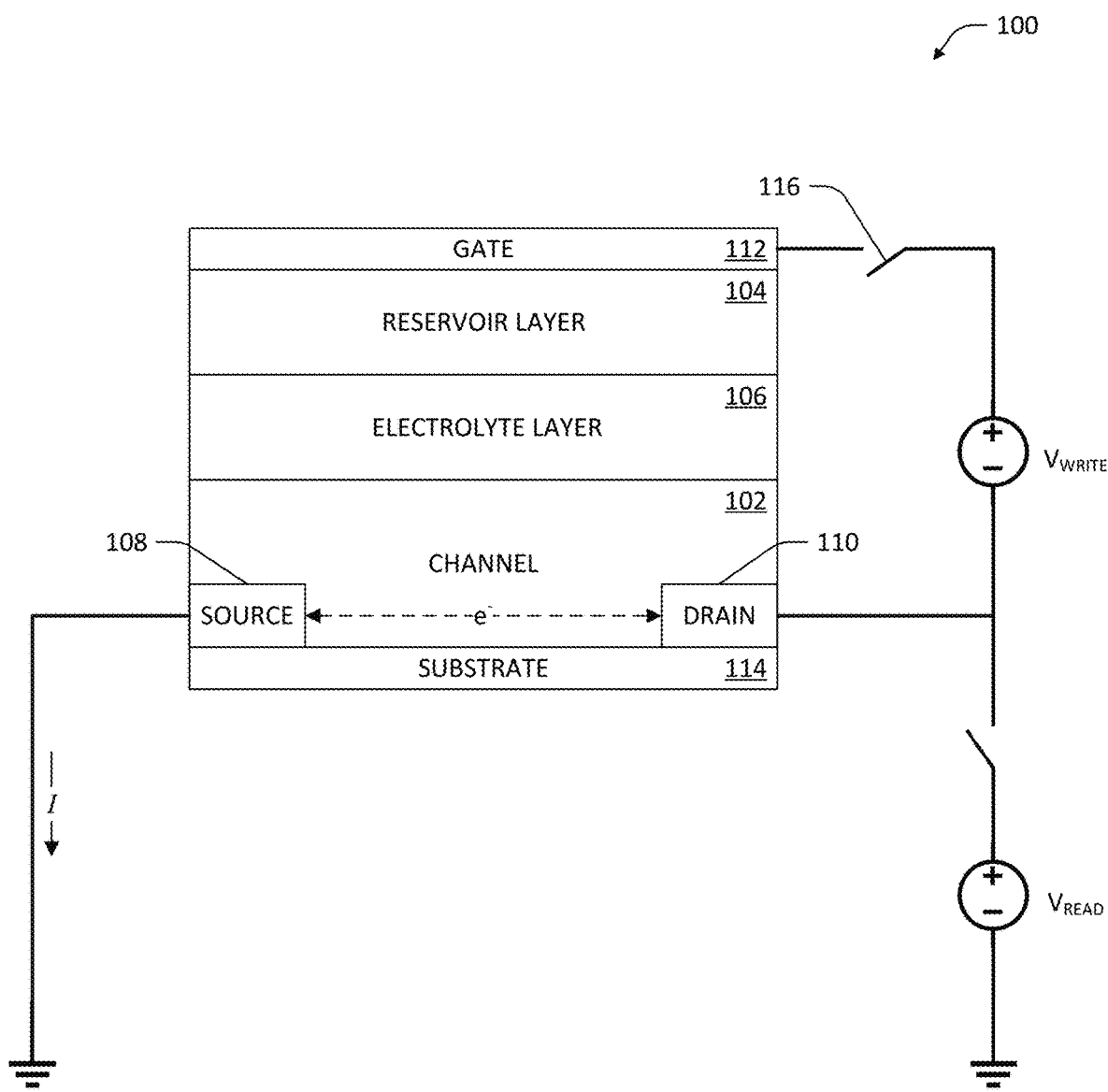
FIG. 1 is a diagram of an exemplary thermally sensitive ionic redox transistor.

Various technologies pertaining to a thermally sensitive ionic redox transistor are now described with reference to the drawings, wherein like reference numerals are used to refer to like elements throughout. In the following description, for purposes of explanation, numerous specific details are set forth in order to provide a thorough understanding of one or more aspects. It may be evident, however, that such aspect(s) may be practiced without these specific details. In other instances, well-known structures and devices are shown in block diagram form in order to facilitate describing one or more aspects. Further, it is to be understood that functionality that is described as being carried out by certain system components may be performed by multiple components. Similarly, for instance, a component may be configured to perform functionality that is described as being carried out by multiple components.

Moreover, the term "or" is intended to mean an inclusive "or" rather than an exclusive "or." That is, unless specified otherwise, or clear from the context, the phrase "X employs A or B" is intended to mean any of the natural inclusive permutations. That is, the phrase "X employs A or B" is satisfied by any of the following instances: X employs A; X employs B; or X employs both A and B. In addition, the articles "a" and "an" as used in this application and the appended claims should generally be construed to mean "one or more" unless specified otherwise or clear from the context to be directed to a singular form.

Further, as used herein, the terms "component" and "system" are intended to encompass computer-readable data storage that is configured with computer-executable instructions that cause certain functionality to be performed when executed by a processor. The computer-executable instructions may include a routine, a function, or the like. It is also to be understood that a component or system may be localized on a single device or distributed across several devices. Additionally, as used herein, the term "exemplary" is intended to mean serving as an illustration or example of something and is not intended to indicate a preference.

It is to be understood that while certain terminology used herein is in common with conventional transistors (e.g., field-effect transistors, or FETs), including but not limited to the terms gate, source, and drain, such terms are not intended to imply commonality of function between elements of conventional transistors and the thermally sensitive ionic redox transistor described herein. By way of example, and not limitation, unlike various types of conventional transistors, the conductance of a channel of the redox transistor does not depend on a voltage being maintained at a gate electrode during operation of the redox transistor.

With reference now to FIG. 1, an exemplary thermally sensitive ionic redox transistor 100 is illustrated. The redox transistor 100 includes a solid channel layer 102, a solid reservoir layer 104, and a solid electrolyte layer 106 disposed between the channel layer 102 and the reservoir layer 104. The redox transistor 100 further includes a plurality of contacts 108-112 that facilitate integration of the transistor 100 with other electronic systems. The contacts 108-112 include a source contact 108, a drain contact 110, and a gate contact 112. In exemplary embodiments, the channel layer 102 of the redox transistor 100 can be deposited on a substrate 114. By way of example, the redox transistor 100 can be deposited on a substrate 114 of Si or $SiO_2$ in a CMOS-compatible manufacturing process.

The conductance of the channel 102 between the source 108 and the drain 110 contacts serves as a "state" of the redox transistor 100. As will be explained in greater detail herein, the redox transistor 100 is non-volatile such that for micro- and nano-scale devices, the conductance state of the channel 102 is retained for several days without continued energy input. The conductance of the channel 102 can be varied by a "write" operation and the present conductance of the channel 102 can be measured by way of a "read" operation, as will be described in greater detail below. The redox transistor 100 can further be used as a neuromorphic computing element that applies a weight to a signal input to the redox transistor 100 based on the present conductance state of the redox transistor 100. A current output at one of the source 108 or the drain contacts 110 is a product of the conductance of the channel 102 and a value of a voltage input to the other of the source 108 or the drain 110. Thus, a current output by the redox transistor 100 can be considered a weighted function of the present conductance state of the redox transistor 100.

The channel 102 comprises a mixed ionic and electronic conductor (MIEC) material that has an electrical conductance that varies as a function of the bulk concentration of ions in the channel layer 102. The conductance of the channel 102 can be modulated by transport of ions into and out of the channel 102. The reservoir layer 104 comprises a MIEC material that can readily accept ions from or donate ions to the channel layer 102. In an exemplary embodiment, the channel layer 102 and the reservoir layer 104 each comprise non-stoichiometric titanium dioxide, or $TiO_{2-\delta}$. Besides $TiO_{2-\delta}$, introduction of ion vacancies increases electronic conductivity in many other nonstoichiometric transition metal oxides such as for example (but not limited to) $VO_{2-\delta}$, $WO_{3-\delta}$, $MoO_{3-\delta}$. Substitution of these and other transition metal oxides for $TiO_{2-\delta}$ would result in a device with similar operating characteristics. In such embodiments, each of the channel layer 102 and the reservoir layer 104 are crystalline layers having a plurality of oxygen vacancies formed therein. In further embodiments, the channel layer 102 and the reservoir layer 104 can be or include materials based on the fluorite structure such as $CeO_{2-\delta}$, materials based on the perovskite structure such as $LaMnO_{3-\delta}$, or amorphous films such as hafnium oxide.

Exchange of ions between the channel layer 102 and the reservoir layer 104 occurs by way of the electrolyte layer 106. At least one of the layers 102-106 has an ionic conductivity with respect to ions in the channel layer 102 and the reservoir layer 104 that is at least 100 times greater at elevated temperatures (between about 80° C. and about 300° C., between about 100° C. and about 250° C., or between about 125° C. and about 200° C.) than at low temperatures (less than 50° C., between about 0° C. and about 50° C., or between about 10° C. and about 50° C.). At low temperatures, ionic conductivity is sufficiently low in at least one of the layers 102-106 that ions are substantially unable to migrate between the channel layer 102 and the reservoir layer 104. When the redox transistor 100 is heated to an elevated temperature, each of the layers 102-106 has sufficiently high ionic conductivity with respect to ions present in the channel layer 102 and the reservoir layer 104 to allow the ions to migrate between the channel 102 and the reservoir layer 104. By way of example, and not limitation, the electrolyte layer 106 can comprise yttria-stabilized zirconia (YSZ) when the channel layer 102 and the reservoir layer 104 are composed of materials that include mobile oxygen vacancies. In other examples, the electrolyte layer can comprise $CeO_2$ or $SrTiO_3$.

Figure 2:
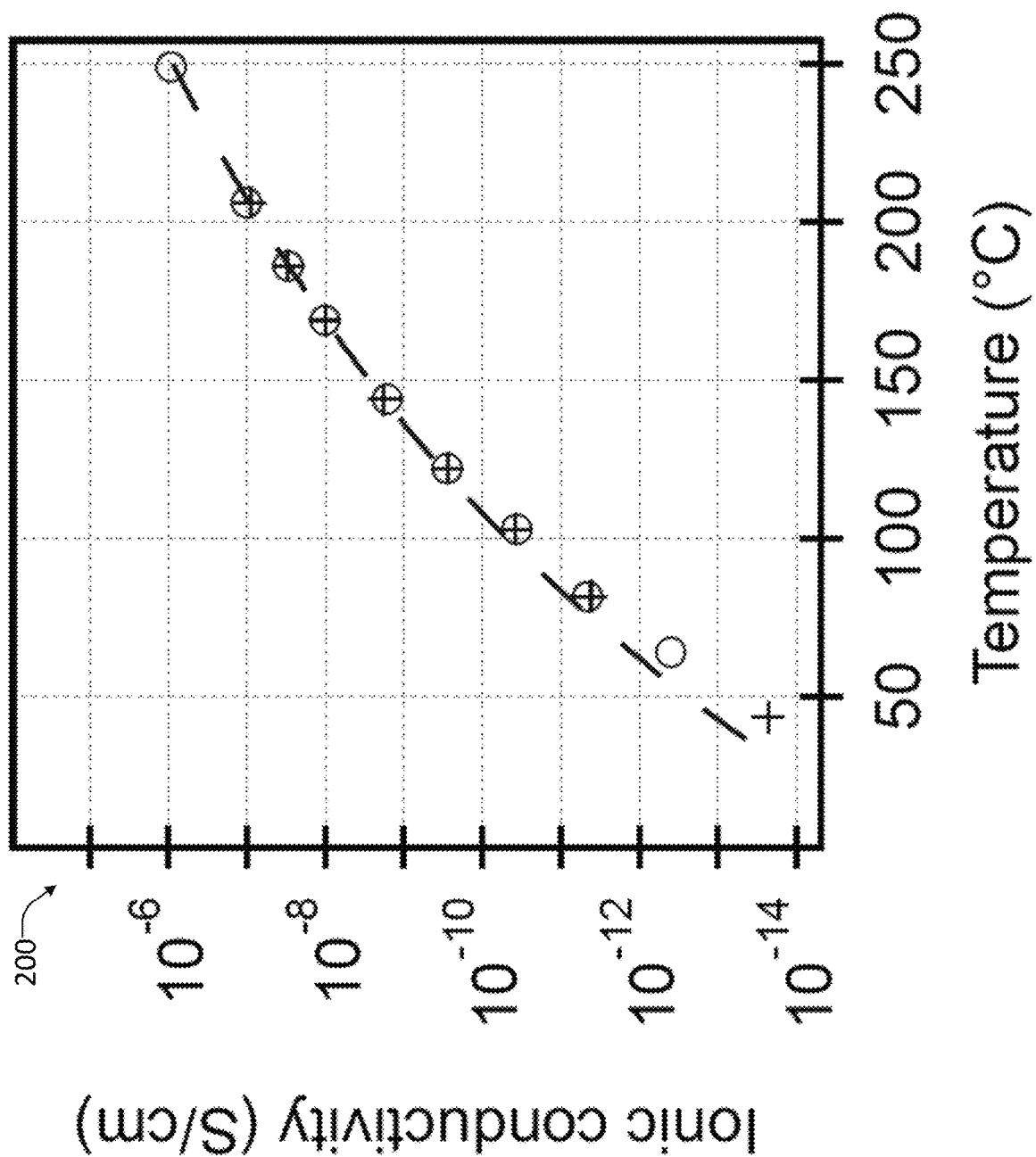
FIG. 2 is a plot of ionic conductivity of yttria-stabilized zirconia (YSZ) versus temperature.

Referring now to FIG. 2, a plot 200 of measurements of ionic conductivity of YSZ at temperatures ranging from about 50° C. to about 250° C. is illustrated. As indicated by the plot 200, the ionic conductivity of YSZ increases as temperature increases in a substantially continuous, albeit nonlinear fashion. In YSZ, the ionic conductivity at 25° C. is about $10^{-14}$ S/cm, the conductivity at 90° C. is about $10^{-11}$ S/cm (1000 times higher than room temperature), and the conductivity at 200° C. is about $10^{-7}$ S/cm. In one exemplary embodiment of the redox transistor 100, the channel layer 102 and the reservoir layer 104 comprise $TiO_{2-\delta}$ and the electrolyte layer 106 comprises YSZ. These materials are generally compatible with CMOS fabrication techniques such as various types of physical or chemical vapor deposition. The redox transistor 100 described herein is therefore suitable for manufacturing in existing fabrication facilities using well-understood manufacturing methods and is further suitable for integration into other existing CMOS-compatible devices.

For some materials, such as YSZ, temperature-variant ionic conductivity results from increased ion vacancy mobility at higher temperatures. For other materials, temperature-variant ionic conductivity may result from increased vacancy concentration in the electrolyte layer 106 at higher temperatures. In a non-limiting example, the electrolyte layer 106 can comprise strontium titanate ($SrTiO_3$).

A write procedure to modify the conductance state of the redox transistor 100 is now described. Write performance of the redox transistor 100 is substantially linear and symmetric, yielding predictable change of conductance state of the redox transistor 100 without a priori knowledge of the present state of the redox transistor 100. As noted above, the conductance of the channel 102 can be varied by control of transport of ions between the channel 102 and the reservoir layer 104. Migration of ions between the channel 102 and the reservoir layer 104 across the electrolyte layer 106 occurs in response to movement of electrons (i.e., electric current) between the channel 102 and the reservoir layer 104. Accordingly, conductance of the channel 102 can be changed in response to voltage pulses being applied between the reservoir layer 104 and the channel 102 (or between metallic contacts in contact with the reservoir 104 and the channel 102, such as the gate 112 and source 108 contacts, respectively). By way of example, a voltage $V_{WRITE}$ applied between the gate contact 112 and the source contact 108 causes an electric current to flow between the channel 102 and the reservoir layer 104.

However, migration of ions across the electrolyte layer 106 is limited by the ionic conductivity of the layers 102-106 with respect to ions present in the channel layer 102 and the reservoir layer 104. At low temperatures, at least one of the layers 102-106 is substantially non-conductive (e.g., at least 100 times less conductive than when the redox transistor 100 is heated to the temperature of the write procedure) to ions present in the channel layer 102 and the reservoir layer 104 that are responsible for the electronic conductance of the channel layer 102. Accordingly, at low temperatures, application of voltage pulses at $V_{WRITE}$ will not cause sufficient ion migration between channel layer 102 and reservoir layer 104 to substantially change the conductance state of channel 102. Thus, at low temperatures, the conductance state of the channel 102 is substantially invariant responsive to voltage pulses at $V_{WRITE}$. The conductance state will not degrade when switch 116 is leaky (e.g., permits electrical current to flow even when the switch is "open"), or even when switch 116 does not exist and there exists a direct electronic path from the reservoir 104 to the channel 102, because ion migration from the channel 102 to the reservoir layer 104 is effectively blocked when the redox transistor 100 is at low temperatures.

During a write operation, a change in conductance of the channel 102 exhibits a linear dependence on a number of ions that migrate into or out of the channel 102. A number of ions that migrate into or out of the channel 102 responsive to a voltage pulse applied at $V_{WRITE}$ depends upon a magnitude and duration of the voltage pulse, but also exhibits a linear relationship. Thus, two voltage pulses of equal magnitude and duration cause a substantially same change in conductance of the channel 102. Furthermore, pulses of equal duration and equal but opposite magnitude cause substantially equal but opposite changes in the conductance of the channel 102.

Figure 3:
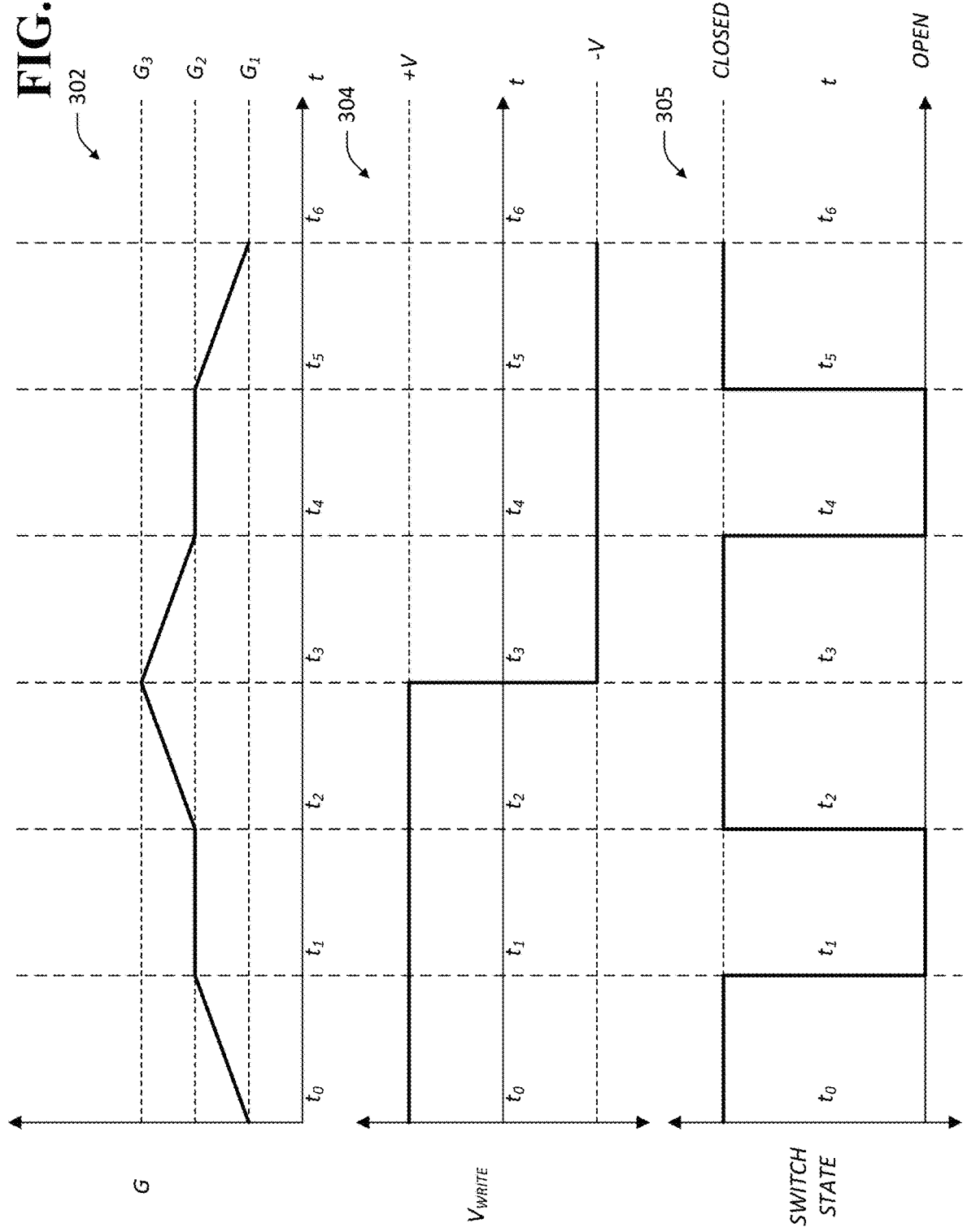
FIG. 3 illustrates corresponding conceptual channel conductance, write-voltage, and switch state diagrams with respect to a thermally-sensitive ionic redox transistor.

To illustrate further, and referring now to FIG. 3, a conceptual channel conductance plot 302, an exemplary $V_{WRITE}$ voltage plot 304, and a plot 305 of a state of the switch 116 are illustrated, which together illustrate certain write performance features of the redox transistor 100 when the redox transistor 100 is heated to an elevated temperature. Time is depicted on the x-axis of the plots 302, 304, 305. Conductance G of the channel 102 is depicted on the y-axis of the channel conductance plot 302. The voltage $V_{WRITE}$ that is applied between the gate 112 and the drain 110 is depicted on the y-axis of the $V_{WRITE}$ voltage plot. The state of the switch 116, closed or open, is depicted on the y-axis of the switch state plot 305. From time $t_0$ to time $t_1$, the voltage $V_{WRITE}$ takes the value V and the switch 116 is closed, such that there is a drop in electric potential from the reservoir 104 to the channel 102. As a result, in the same period, the conductance of the channel 102, G, undergoes a substantially linear change from $G_1$ to $G_2$ as ions migrate into or out of the channel 102, which direction of migration may depend upon whether the ions are n- or p-type dopants, a material-dependent factor. While the conductance G of the channel 102 is depicted in the plot 302 as increasing in response to a positive value of voltage $V_{WRITE}$, it is to be understood that whether the conductance G increases or decreases in response to a voltage will depend on whether the voltage causes ions to migrate into or out of the channel layer 102. From $t_1$ to $t_2$, the switch 116 is open, and the conductance G does not change. Once a concentration of ions in the channel 102 is set by way of application of a voltage pulse between the source contact 108 and the gate contact 112, the conductance of the channel 102 remains stable until another voltage pulse is applied between the drain 110 and the gate 112. Thus, when no voltage is applied, the conductance of the channel 102 stays constant. From $t_2$ to $t_3$ the voltage $V_{WRITE}$ takes the value V again and the switch 116 is closed, and the conductance G undergoes another substantially linear increase from $G_2$ to $G_3$. Since the same voltage is applied for the same duration, the conductance increase from $G_2$ to $G_3$ is substantially the same magnitude as the conductance increase from $G_1$ to $G_2$ (e.g., ±5%). From $t_3$ to $t_4$, the voltage $V_{WRITE}$ takes the value –V, equal and opposite to the magnitude of the voltage $V_{WRITE}$ from time $t_2$ to $t_3$. In the same period $t_3$ to $t_4$, since the switch 116 is closed the conductance G undergoes a substantially linear decrease from $G_3$ to $G_2$. Thus, two voltage pulses at $V_{WRITE}$ of the same duration and equal but opposite magnitudes yield conductance changes that cancel one another. In the period $t_4$ to $t_5$, the conductance G does not change since the switch 116 is open and thus there is no $V_{WRITE}$ applied between the reservoir layer 104 and the channel 102. From $t_5$ to $t_6$, the voltage $V_{WRITE}$ continues to take the value –V and the switch 116 is closed, and thus the conductance G decreases from $G_2$ to $G_1$. As will be understood by those of skill in the art in view of the present disclosure, the change in conductance of the channel 102 resulting from a voltage pulse $V_{WRITE}$ is not substantially dependent on the present conductance state of the channel 102. Furthermore, a conductance change in the channel 102 can be reversed by application of a voltage pulse having opposite polarity to the pulse used to initially cause the conductance change.

Figure 4:
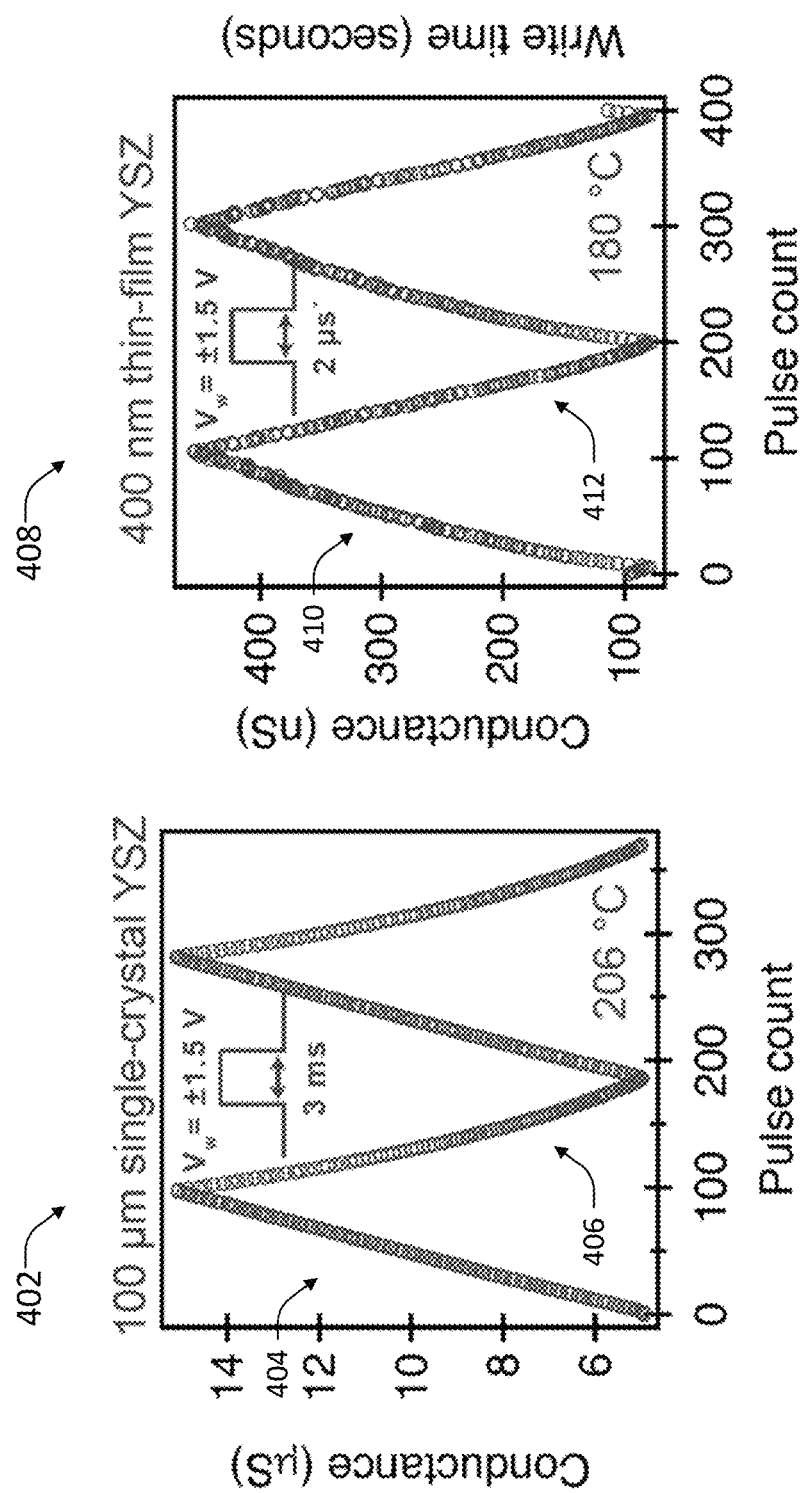
FIG. 4 depicts experimental conductance values of certain exemplary embodiments of a thermally-sensitive ionic redox transistor in response to voltage pulses.

Referring now to FIG. 4, experimental results of channel conductance plotted versus voltage pulse count for two different thermally-sensitive ionic redox transistors are shown, confirming substantially linear and symmetric channel conductance modulation. A first channel conductance plot 402 depicts channel conductance of a thermally-sensitive ionic redox transistor having a single-crystal YSZ electrolyte of 100 micron thickness, plotted against pulse count for a plurality of pulses $V_{WRITE}$ of magnitude ±1.5V and duration of 3 ms applied while the redox transistor was heated to a temperature of 206° C. As can be seen from a first rising edge 404 of the conductance plot 402, approximately 90 pulses at positive $V_{WRITE}$=1.5 V increased conductance of the channel 102 from approximately 5 µS to approximately 15 µS. Similarly, on a falling edge 406 of the conductance plot 402, approximately 90 pulses of opposite magnitude at $V_{WRITE}$ decreased conductance of the channel 102 from approximately 15 µS to approximately 5 µS.

A second channel conductance plot 408 depicts channel conductance of a thermally-sensitive ionic redox transistor having a 400-nanometer-thick thin-film YSZ electrolyte. Voltage pulses $V_{WRITE}$ of magnitude ±1.5V and duration of 2 µs were applied while the redox transistor was heated to a temperature of 180° C. A rising edge 410 of the plot 408 illustrates that approximately 100 pulses increased the channel conductance from less than 100 nS to approximately 450 nS. A falling edge 412 of the plot 408 illustrates that approximately 100 pulses of opposite magnitude decreased the channel conductance from approximately 450 nS to less than 100 nS. Experimental results have indicated that several hundred distinguishable analog conductance states (e.g., greater than 100, greater than 200, or greater than 500) can be written to the redox transistor 100 described herein, and these states reliably retained for periods of days after the device is cooled to low temperatures when the gate 112 is shorted to the source 108 or the drain 110 (i.e., such that the reservoir 104 and channel 102 layers are electrically shorted).

The write time required to change the resistance or conductance state of the channel 102 by a given amount depends at least in part upon the thickness of the electrolyte layer 106 (e.g., where the thickness refers to a thickness of the electrolyte layer 106 between the reservoir layer 104 and the channel layer 102). Thus, in some embodiments it may be desirable that the electrolyte layer 106 is relatively thin (e.g., between 100 nanometers and 1 micron) in order to improve a response time over which the conductance of the channel 102 changes in response to a voltage pulse $V_{WRITE}$. Experimental results indicate that the write time required to change conductance state of the channel 102 depends further on the temperature of the redox transistor 100. In general, a higher temperature yields a lower write time for a given value of conductance state change. It is to be understood that for a given voltage pulse value, the write time required to reach a desired conductance state in the channel 102 will vary depending on a current conductance state of the channel 102.

After the conductance of the channel layer 102 is set to a desired state by way of the write procedure described above, the temperature of the redox transistor 100 can be reduced to a temperature below the elevated temperature (e.g., room temperature) in order to improve retention of the channel conductance state. Subsequently, the conductance state of the channel layer 102 can be read by applying a voltage $V_{READ}$ between the source 108 and the drain 110 and measuring a current I that flows from the source to the drain. The conductance of the channel 102 can be computed by application of Ohm's law wherein the channel conductance G is equal to $I/V_{READ}$. Channel resistance between the source 108 and the drain 110 on the order of tens to hundreds of MΩ was observed in experimental measurements of micro- and nano-scale embodiments of the thermally-sensitive ionic redox transistor 100.

Figure 5B:
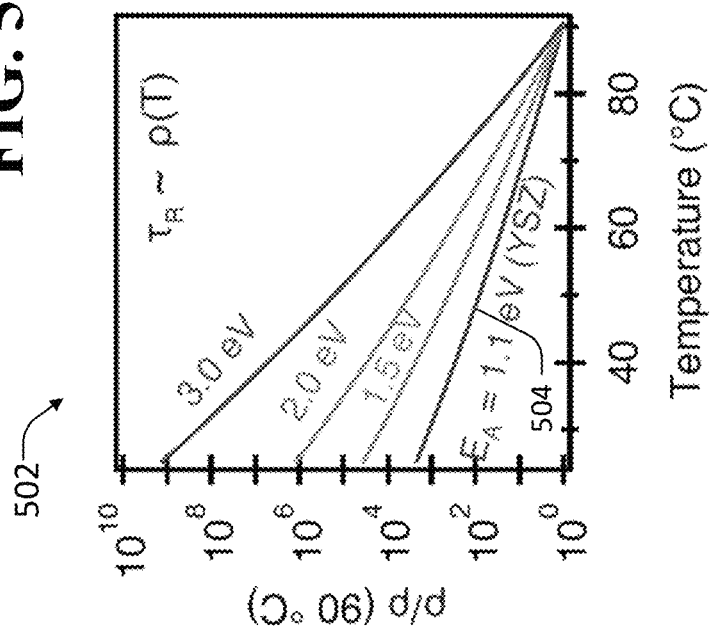
FIG. 5B is an exemplary plot of the ratio of the retention time of thermally-sensitive redox transistors to the retention time at 90° C. plotted against temperature for various electrolytes.
Figure 5A:
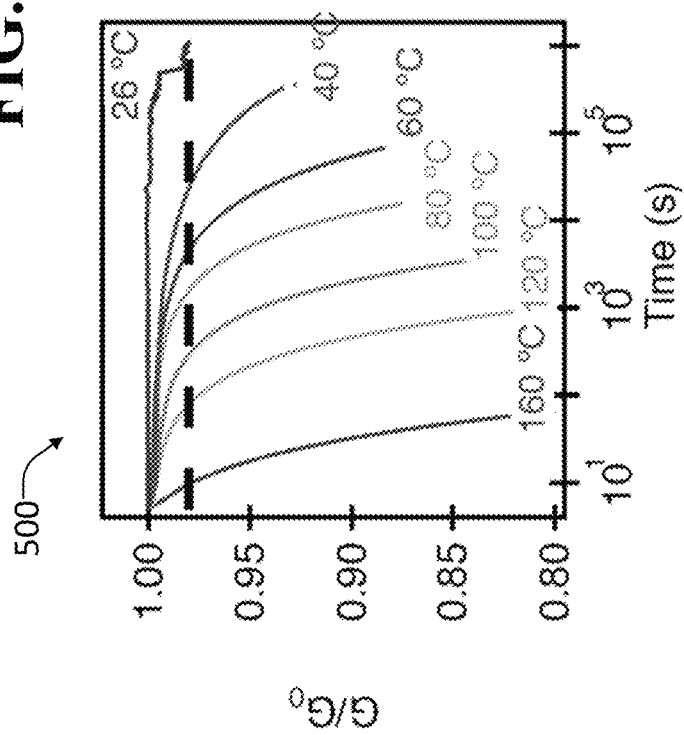
FIG. 5A is an exemplary plot of experimental results of channel conductance of a thermally-sensitive redox transistor normalized to an initial conductance state value plotted versus time.

Thermally-sensitive redox transistors constructed in accordance with the present disclosure have been shown to retain state for extended periods (e.g., several days) at room temperature. By way of example, and with reference now to FIG. 5A, a plot 500 of experimental results of channel conductance of a thermally-sensitive redox transistor normalized to an initial conductance state value plotted versus time is shown for a plurality of temperatures. As the plot 500 indicates, the conductance state of the channel 102 of the thermally-sensitive redox transistor 100 decays more slowly at lower temperatures. In one embodiment, a thermally-sensitive redox transistor 100 was shown to experience less than 2% degradation in channel conductance after 10 days at a temperature less than 50° C. (e.g., approximately 25° C.). Thus, the thermally-sensitive redox transistor 100 described herein exhibits substantially improved state retention performance as compared to other redox transistors, which exhibit state loss after only several seconds in micro- and nano-scale devices.

Further, higher activation energies of ions can provide a higher ratio of the elevated-temperature retention time to the low temperature retention time. By way of further example, and with reference now to FIG. 5B, a plot 502 of the ratio of the retention time (which is proportional to the ionic resistance) of a thermally sensitive redox transistor to the retention time at 90° C. is shown plotted against temperature for electrolytes having various activation energies. Stated differently, the plot 502 depicts a factor by which retention time is increased as temperature is decreased below 90° C. By way of example, the lowest line 504 of the plot 502 shows that an embodiment wherein the electrolyte layer 106 is composed of YSZ, which has an oxygen vacancy activation energy of about 1.1 eV, exhibits a retention time more than 100 times greater at 40° C. than at 90° C. Accordingly, electrolytes made up of perovskites such as $CaTiO_3$ or $CaZrO_3$, with ion activation energies on the order of about 3 eV, may provide the thermally-sensitive redox transistor 100 with much longer state retention times than electrolytes made up of YSZ, which has an oxygen vacancy activation energy of about 1.1 eV.

Figure 6:
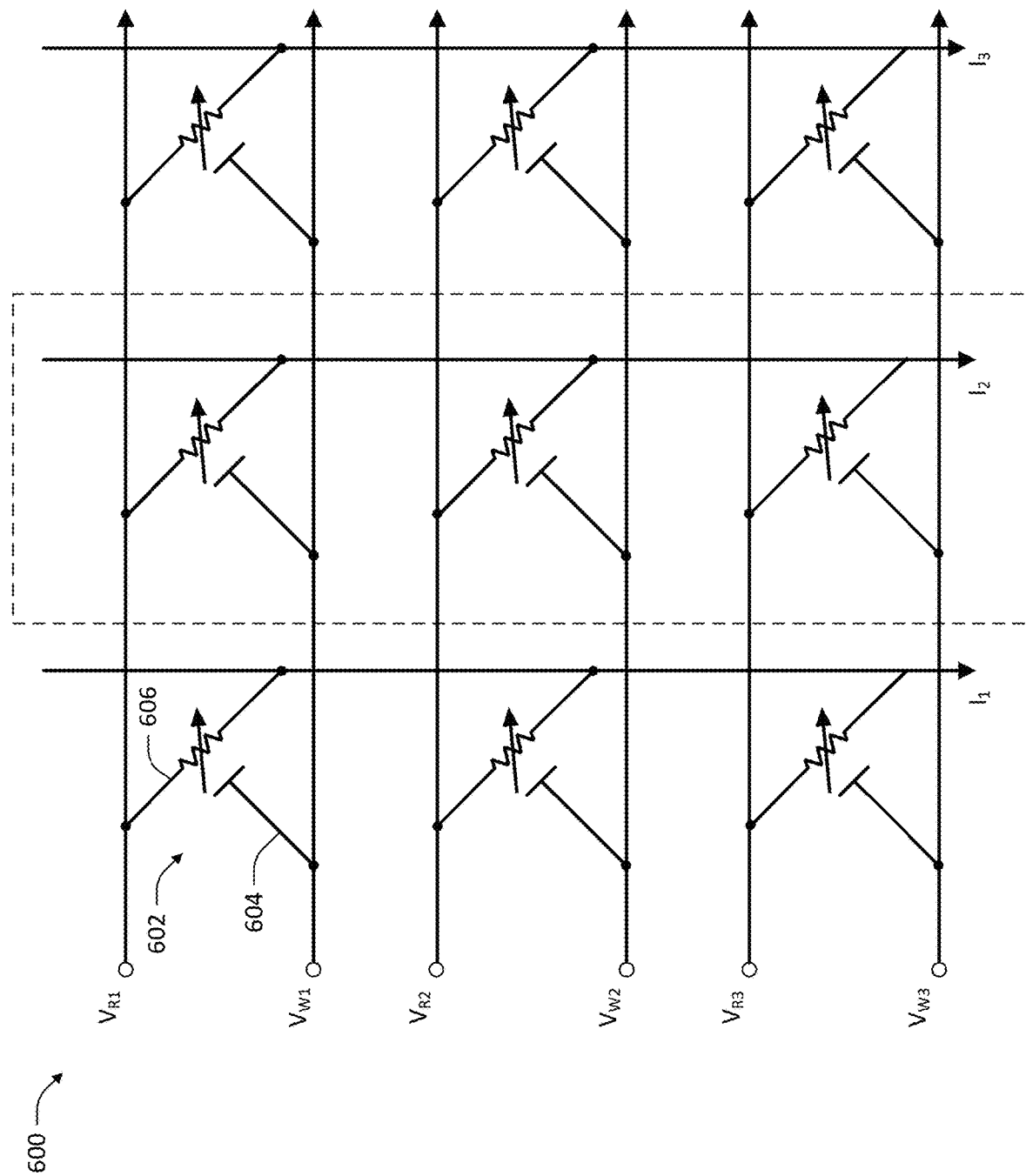
FIG. 6 is a partial circuit diagram of an exemplary crossbar memory device that incorporates a thermally-sensitive ionic redox transistor.
Figure 7:
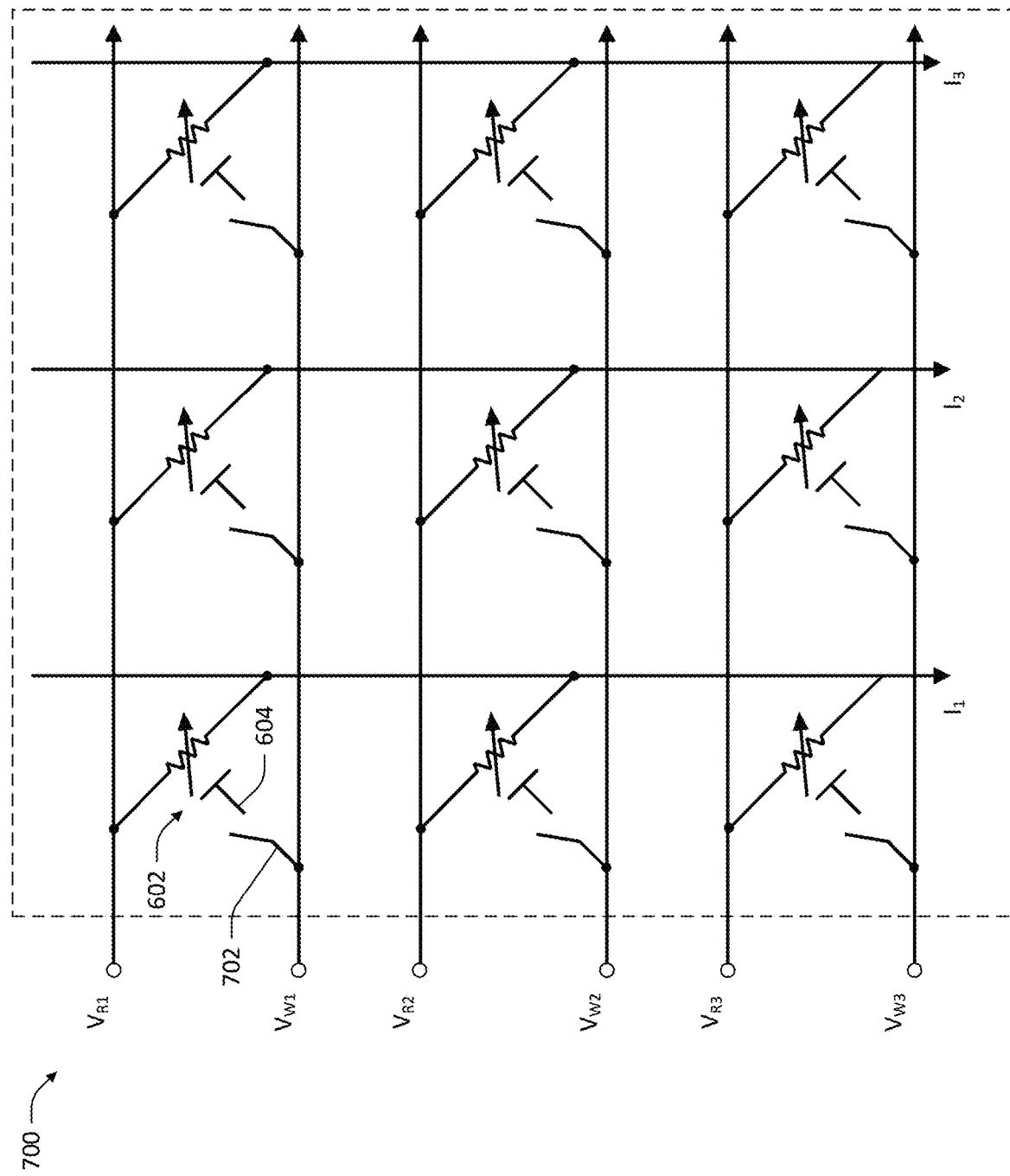
FIG. 7 is a partial circuit diagram of another exemplary crossbar memory device that incorporates a thermally-sensitive ionic redox transistor.

Referring now to FIG. 6, a partial circuit diagram of an exemplary crossbar memory array 600 that incorporates thermally-sensitive ionic redox transistors 602 is shown. The memory array 600 is a 3×3 array addressable by 3 voltage write lines $V_{W1}$-$V_{W3}$ and 3 voltage read lines $V_{R1}$-$V_{R3}$. It is to be understood that while the crossbar memory array 600 shown in FIG. 6 (and similarly, a crossbar memory array 700 shown in FIG. 7) is a 3×3 array, principles described herein are applicable to arrays of substantially any size. The write lines $V_{W1}$-$V_{W3}$ are connected to gate contacts 604 of the redox transistors 602 along rows of the array 600. The read lines $V_{R1}$-$V_{R3}$ are connected to either sources or drains 606 of the redox transistors 602 along rows of the array 600. Current collector lines $I_1$-$I_3$ are connected to the other of the sources or drains 606 along columns of the array 600. Each of the gates 604 of the redox transistors 602 is connected to the same voltage write line as the other redox transistors 602 in its row, either its source or drain 606 is connected to the same voltage read line as the other redox transistors 602 in its row, and the other of its source or drain 606 is connected to the same current collector line as the other redox transistors 602 in its column. A conductance state of a redox transistor 602 in the array 600 can be read by applying a voltage to the voltage read line of the row that corresponds to the redox transistor 602 and measuring the current of the collector line of the column that corresponds to the redox transistor 602. The conductance state can then be determined by an application of Ohm's law given the known write voltage and measured collector line current.

In the crossbar memory array 600, columns of redox transistors 602 can be selectively heated to an elevated temperature, one column at a time. An individual redox transistor 602 can therefore be written by heating the column that corresponds to the redox transistor 602 and then applying a write voltage pulse or pulses at the voltage write line of the row that corresponds to the redox transistor 602. Since the state of a redox transistor 602 of the array 600 is only changed when the redox transistor 602 is both heated to an elevated temperature and pulsed at its gate contact 604 by a voltage pulse, heating a single column and energizing a single voltage write line of the array 600 uniquely identifies a single element of the array 600 for a write operation.

If a memory array is heated in its entirety rather than selectively, a different means of selecting a redox transistor for writing a conductance state to a single redox transistor in the array can be used. By way of example, and referring now to FIG. 7, a partial circuit diagram of an exemplary crossbar memory array 700 that includes the redox transistors 602 is shown, wherein each of the redox transistors 602 is further addressed for writing by way of a selector switch 702 that is positioned between the gate contact 604 of the redox transistor 602 and its voltage write line (e.g., $V_{W1}$). In the array 700, read operations occur in the same manner as described above with respect to the array 600 of FIG. 6. To perform a write operation with respect to one of the redox transistors 602 of the array 700, the array 700 is heated to an elevated temperature. The voltage write line corresponding to the row of the desirably addressed redox transistor 602 is energized with a desired write voltage. The selector switch 702 of the redox transistor 602 is then closed to apply the write voltage to the gate 604 of the redox transistor 602. In order to simplify addressing of elements in the array 700, selector switches 702 of redox transistors 602 in the same column of the array 700 can be collectively controlled such that switches 702 in the same column of the array 700 are closed and reopened by a single control signal. Thus, to perform a write operation of a redox transistor 602 in the array 700, the voltage write line of the row corresponding to the redox transistor 602 can be energized, and the selector switches of the column corresponding to the redox transistor 602 can be closed.

Figure 8:
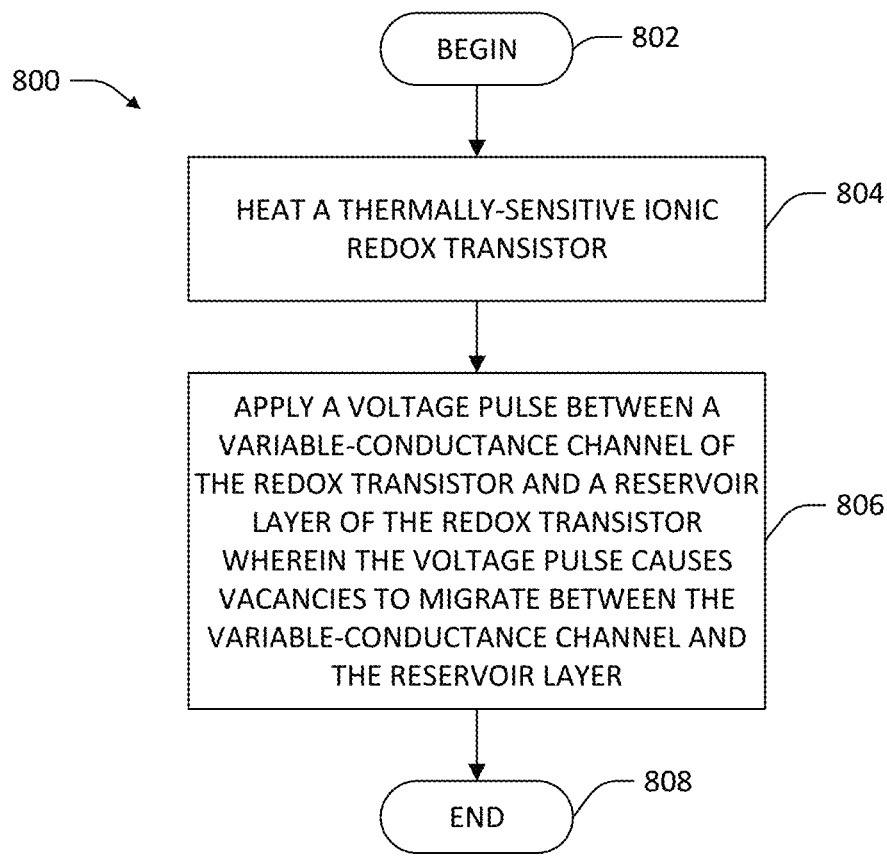
FIG. 8 is a flow diagram that illustrates an exemplary methodology for performing a write operation with respect to a thermally-sensitive ionic redox transistor.
Figure 9:
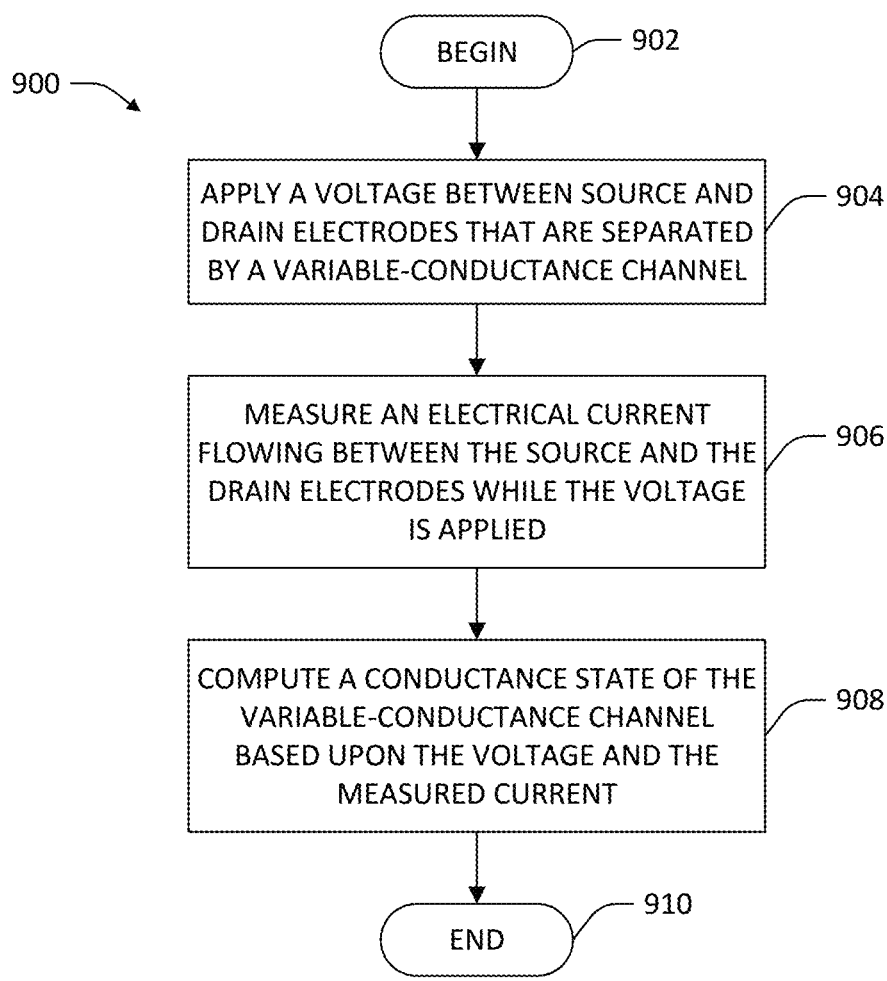
FIG. 9 is a flow diagram that illustrates an exemplary methodology for performing a read operation with respect to a thermally-sensitive ionic redox transistor.

FIGS. 8 and 9 illustrate exemplary methodologies relating to writing and reading conductance states of a thermally-sensitive ionic redox transistor, respectively. While the methodologies are shown and described as being a series of acts that are performed in a sequence, it is to be understood and appreciated that the methodologies are not limited by the order of the sequence. For example, some acts can occur in a different order than what is described herein. In addition, an act can occur concurrently with another act. Further, in some instances, not all acts may be required to implement a methodology described herein.

Referring now to FIG. 8, a methodology 800 that facilitates writing a conductance state to a thermally-sensitive ionic redox transistor is illustrated. The methodology 800 begins at 802, and at 804 a thermally-sensitive ionic redox transistor (e.g., the redox transistor 100) is heated to an elevated temperature. While the redox transistor is at the elevated temperature, at 806 a voltage pulse is applied between a variable-conductance channel of the redox transistor and a reservoir layer of the redox transistor, wherein the voltage pulse causes ions to migrate between the channel and the reservoir layer. The migration of ions in turn causes an increase or decrease in the conductance of the channel layer. The step 806 can be repeated as many times as required to reach a desired conductance state of the channel of the redox transistor. The methodology 800 then completes 808.

Referring now to FIG. 9, a methodology 900 that facilitates reading a conductance state of a thermally-sensitive ionic redox transistor (e.g., the redox transistor 100) is illustrated. The methodology 900 begins at 902 and at 904 a voltage is applied between source and drain contacts of the redox transistor, which are separated by a variable-conductance channel. At 906, an electrical current flowing between the source and the drain contacts is measured while the voltage is being applied 904. At 908, a conductance state of the channel of the redox transistor is computed based upon the voltage applied at 904 and the current measured at 906, by application of Ohm's law. The methodology 900 ends at 910.

What has been described above includes examples of one or more embodiments. It is, of course, not possible to describe every conceivable modification and alteration of the above devices or methodologies for purposes of describing the aforementioned aspects, but one of ordinary skill in the art can recognize that many further modifications and permutations of various aspects are possible. Accordingly, the described aspects are intended to embrace all such alterations, modifications, and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A device, comprising:
   a channel layer having a conductance that is variable, wherein the channel layer is a solid;
   a reservoir layer, wherein the reservoir layer is a solid;
   an electrolyte layer positioned between the channel layer and the reservoir layer, the electrolyte layer being a solid comprising yttria-stabilized zirconia (YSZ), wherein when the device is heated to between about 80° C. and about 300° C., ions or vacancies migrate between the reservoir layer and the channel layer by way of the electrolyte layer responsive to a voltage being applied between the reservoir layer and the channel layer, wherein the conductance of the channel layer changes responsive to the ions or vacancies migrating between the reservoir layer and the channel layer.

2. The device of claim 1, wherein responsive to the voltage being applied between the reservoir layer and the channel layer, vacancies migrate between the reservoir layer and the channel layer by way of the electrolyte layer.

3. The device of claim 2, wherein the vacancies are oxygen vacancies.

4. The device of claim 1, wherein the reservoir layer comprises titanium oxide having a plurality of oxygen vacancies formed therein.

5. The device of claim 1, wherein the channel layer comprises titanium oxide having a plurality of oxygen vacancies formed therein.

6. The device of claim 1, wherein responsive to the electrolyte layer being heated, a concentration of ions or vacancies in the electrolyte layer increases.

7. The device of claim 1, wherein responsive to the device being heated, an ionic conductivity of at least one of the electrolyte layer, the channel layer, or the reservoir layer increases.

8. The device of claim 1, wherein at a temperature of less than 50° C. a conductance of the channel degrades by less than 2% after 10 days.

9. The device of claim 1, wherein at least one of the channel layer or the reservoir layer comprises $VO_{2-\delta}$.

10. The device of claim 1, wherein when the device is at a temperature less than about 50° C., the conductance of the channel layer is substantially unchanged responsive to the voltage being applied between the reservoir layer and the channel layer.

11. The device of claim 1, further comprising:
    a source electrical contact disposed at a first end of the channel layer;
    a drain electrical contact disposed at a second end of the channel layer opposite the first end; and
    a gate electrical contact disposed on the reservoir layer.

12. The device of claim 1, wherein at least one of the channel layer or the reservoir layer comprises $MoO_{3-\delta}$.

13. The device of claim 1, wherein at least one of the channel layer or the reservoir layer comprises $CeO_{2-\delta}$.

14. The device of claim 1, wherein at least one of the channel layer or the reservoir layer comprises $LaMnO_{3-\delta}$.

15. The device of claim 1, wherein at least one of the channel layer or the reservoir layer comprises $HfO_{2-\delta}$.

16. A method, comprising:
    heating, to a temperature between about 80° C. and about 300° C., a device that comprises an electrolyte layer that comprises yttria-stabilized zirconia (YSZ) and that is positioned between a reservoir layer that is solid and a channel layer that is solid and that has a conductance that is variable;
    applying a voltage between the reservoir layer and the channel layer while the device is at the temperature between about 80° C. and about 300° C., wherein responsive to the voltage being applied, ions or vacancies migrate between the reservoir layer and the channel layer by way of the electrolyte layer, and wherein the conductance of the channel layer changes responsive to the ions or vacancies migrating between the reservoir layer and the channel layer.

17. The method of claim 16, wherein oxygen vacancies migrate between the reservoir layer and the channel layer responsive to the voltage being applied.

18. The method of claim 16, further comprising:
    applying a second voltage between a first electrical contact and a second electrical contact, the first electrical contact is in contact with the channel layer at a first end of the channel layer, the second electrical contact is in contact with the channel layer at a second end of the channel layer; and
    reading a state of the device, wherein reading the state comprises:
    measuring a magnitude of current flow between the first electrical contact and the second electrical contact while the second voltage is applied, wherein the magnitude of the current flow is indicative of the state of the device.

19. The method of claim 16, wherein reading the state of the device further comprises computing a conductance of the channel layer based upon the second voltage and the magnitude of the current flow, wherein the conductance is indicative of the state of the device.

20. An analog memory device comprising:
a source contact;
a drain contact;
a gate contact;
a channel layer disposed between the source contact and the drain contact, the channel layer having a conductance that is variable;
a reservoir layer having the gate contact deposited thereon;
an electrolyte layer that comprises yttria-stabilized zirconia (YSZ), the electrolyte layer positioned between the channel layer and the reservoir layer, wherein, when the analog memory device is heated to a temperature between about 80° C. and about 300° C., ions migrate between the reservoir layer and the channel layer by way of the electrolyte layer responsive to a voltage being applied between the gate contact and one of the source contact or the drain contact, wherein the conductance of the channel layer changes responsive to the ions migrating between the reservoir layer and the channel layer.

* * * * *